United States Patent [19]

Moravec et al.

[11] 4,176,207
[45] Nov. 27, 1979

[54] NON-BIREFRINGENT THALLIUM IODIDE THIN FILMS FOR SURFACE PROTECTION OF HALIDE OPTICAL ELEMENTS

[75] Inventors: Thomas J. Moravec, Eden Prairie; Richard A. Skogman, Minneapolis, both of Minn.

[73] Assignee: Honeywell Inc., Minneapolis, Minn.

[21] Appl. No.: 952,764

[22] Filed: Oct. 19, 1978

[51] Int. Cl.$^2$ .......................... G02B 1/10; B05D 1/36
[52] U.S. Cl. .................................. 427/160; 427/162; 427/164
[58] Field of Search .................. 427/160, 162, 164

[56] References Cited

U.S. PATENT DOCUMENTS

| | | | |
|---|---|---|---|
| 3,959,548 | 5/1976 | Bernal | 427/164 X |
| 4,009,300 | 2/1977 | Chaffin | 427/162 |
| 4,110,489 | 8/1978 | Chaffin et al. | 427/160 X |

Primary Examiner—James R. Hoffman
Attorney, Agent, or Firm—Omund R. Dahle

[57] ABSTRACT

A method of providing non-birefringent cubic thallium iodide thin films on potassium chloride optical elements. The method of this invention is to deposit thin film alternating layers of thallium iodide and a buffer material such that a composite coating is obtained. The optic buffer material may be lead fluoride. The thallium iodide film made by the method of this invention is highly transparent, insoluble and non-scattering.

4 Claims, 6 Drawing Figures

NON-BIREFRINGENT THALLIUM IODIDE THIN FILMS FOR SURFACE PROTECTION OF HALIDE OPTICAL ELEMENTS

ORIGIN OF THE INVENTION

The present invention was made under a contract with the Department of Defense.

BACKGROUND AND SUMMARY OF THE INVENTION

This invention is concerned with surface protection of water soluble halide solids for use as optical components in infrared systems.

One of the more critical problems encountered in the development of high power infrared lasers is the development of laser windows which are highly transparent to laser radiation at 10.6 microns and at 3 to 5 microns.

The need for improved laser windows is based on the extremely high laser power throughput required and the fact that laser windows constitute structural members. In order to maintain high throughput and minimize adverse effects, the amount of energy transferred to the window must be kept low. Laser beam energy can be transferred to the window in two ways: heating of the window caused by either bulk or surface absorption of the beam, or direct conversion of the beam energy to mechanical energy by brillouin scattering or electrostriction. This energy transfer produces several undesirable effects such as lensing and birefringence, which result in degradation of beam quality and polarization. In extreme cases, severe thermal stresses can be produced in the windows. These stresses, which are further aggravated by the fact that the windows are mounted in a cooling clamp, may lead to fracture of the windows.

The low absorption coefficients of the halides make them outstanding candidates for optical components in infrared systems. The alkali halides exhibit low absorption at 10.6 microns, and the alkaline earth halides exhibit low absorption in the 2 to 6 micron region. Furthermore, because the temperature coefficient of the index of refraction and the coefficient of thermal expansion have opposite signs for these materials, the two effects tend to compensate optical path changes due to temperature, making these materials useful in applications in which heating by a laser beam is anticipated. A limiting factor in the use of the halides, however, is that many halides, in particular the alkali halides, have the undesirable property of being water soluble and cannot, therefore, be used in humid environments.

Despite extensive research efforts, the problem of anti-reflective (AR) surface protection still has problems to overcome. In the earlier efforts the conventional coating methods for sealing the surface of the halide solid from environmental humidity have generally failed for one of two reasons. First, the coatings lose their integrity during thermal cycling because of differences of coefficient of thermal expansion between the coating material and the substrate. This is a serious problem because the large coefficient of thermal expansion of halides tends to result in coatings that are in tension. It has not been uncommon for the protective coating to peel off a halide window during use. Second, the coating material is sufficiently opaque in the infrared to negate the extremely low optical loss which makes the halides attractive. Subsequently, the advantages of thallium iodide films for surface protection have been described in other patents assigned to the same assignee as the present invention, one, U.S. Pat. No. 3,959,548 entitled "Graded Composition Coatings for Surface Protection of Halide Optical Elements", another U.S. Pat. No. 4,009,300 entitled "Preparation of Graded Composition Protective Coatings", and U.S. Pat. No. 4,110,489 entitled, "Preparation of Low Absorption Transparent Thallium Iodide Films on Potassium Chloride". Thallium iodide is naturally birefringent, however owing to its orthorhombic crystal structure, and thallium iodide thin films on potassium chloride optical elements tend to scatter light due to the birefringent nature of thallium iodide. In the U.S. Pat. No. 4,110,489 the thallium iodide was condensed in its cubic phase on potassium chloride and allowed to transform to its stable orthorhombic phase. That improvement did not eliminate the birefringence but did reduce scattering. Investigation has established that thallium iodide does exist in a non-birefringent cubic form at atmospheric pressure above about 170° C. and at room temperature at a pressure of about 5K bar. Alloys of thallium iodide can also exist in cubic form, i.e. thallium bromo-iodide. For most optics applications, however, thallium iodide films cannot be used at 170° C. or at 5K bar pressure. Alloying of thallium iodide degrades its desirable properties of high infrared transparency and low water solubility.

In the present invention there is provided an improved method for making pure (unalloyed) cubic thallium iodide in which there is eliminated the birefringence in thallium iodide thin films. The present invention provides thin films of thallium iodide to be cubic at room temperature and atmospheric pressure ambient. This invention employs neither elevated substrate temperatures, high pressures, or alloying to obtain cubic thallium iodide films. The thallium iodide films made by the method of this invention are highly transparent, insoluble, and non-scattering. The method of this invention is to deposit thin alternating layers of thallium iodide and some other buffer material, such as lead fluoride in a programmed manner such that a composite coating is obtained.

DESCRIPTION

The present invention has been used to successfully prepare a non-birefringent thallium iodide thin film on a water soluble halide optical body or substrate to provide a non-birefringent protective coating having low water solubility, low optical loss and structural compatability with the halide substrate. Due to its orthorhombic crystal structure thallium iodide is naturally birefringent. In the present invention, however, cubic thallium iodide films are made which are highly transparent, insoluble in water and non-scattering. Generally stated, the method of this invention is to deposit onto the halide optical element a protective coating comprising alternating thin layers of thallium iodide and a buffer material, such as lead fluoride in a manner defined below such that a cubic thallium iodide composite coating is obtained.

Figure 1:
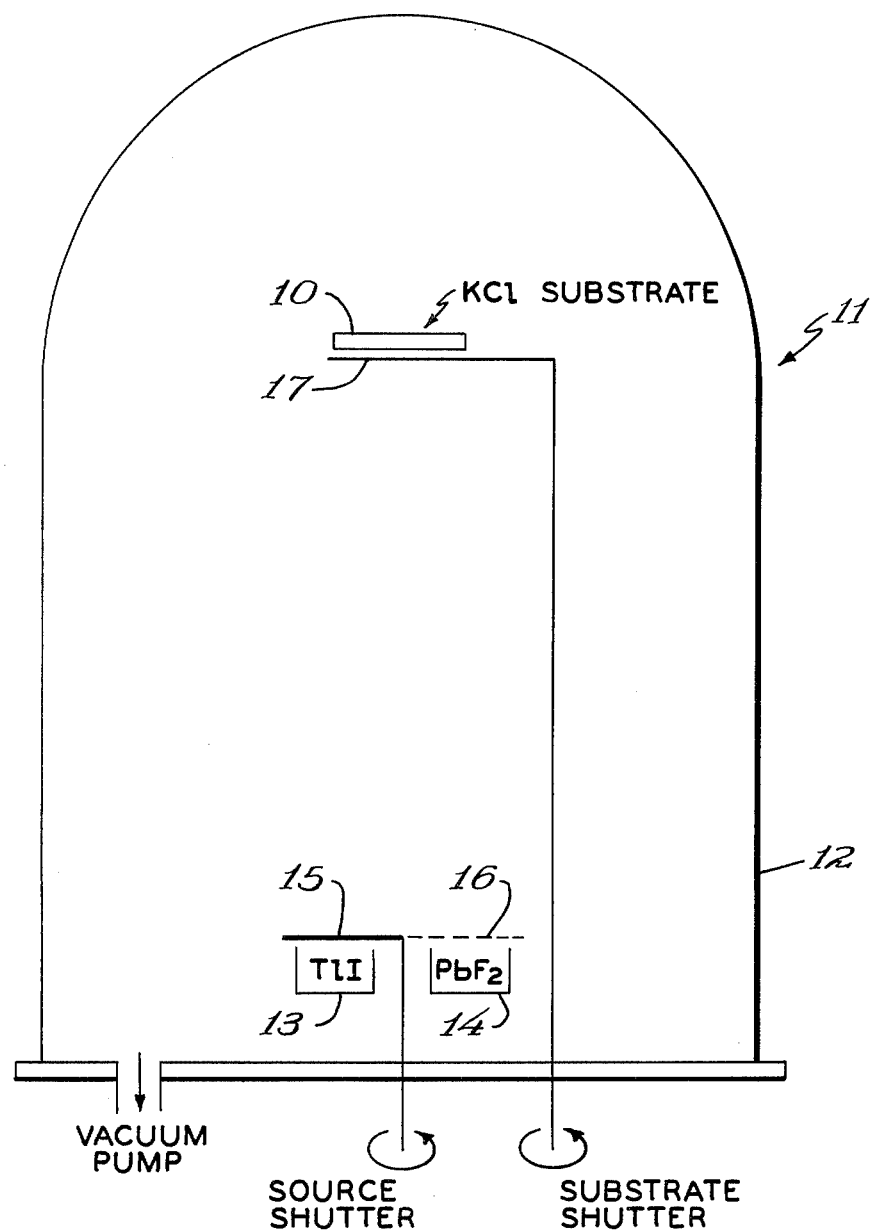
FIG. 1 is a diagrammatic representation of the essential equipment required for thin film deposition by thermal evaporation of alternate layers of thallium iodide and lead fluoride.

The halide optic body to be coated, such as a potassium chloride window or lens 10 is placed in a thin film vacuum deposition system 11 as shown diagrammatically in simplified form in FIG. 1. The system comprises an evacuable envelope 12 such as a bell jar having therein a thallium iodide evaporation source 13 and a lead fluoride evaporation source 14 positioned to cause deposition on element 10. A movable shutter 15 having an alternate position 16 shields the substrate 10 from source 13 or source 14, respectively, the shutter being selectively adjustable to open one or the other sources as desired. A substrate shutter 17 is movable to open the substrate to the evaporant stream. The evaporation sources 13 and 14 include the evaporant in a boat and suitable heating elements such as resistance heaters to maintain the temperature of the evaporant to provide the desired deposition rate.

The details of the process are as follows:
1. Locate in the thin film vacuum deposition system the substrate to be coated.
2. Evacuate the vacuum system to $5 \times 10^{-6}$ torr pressure or lower.
3. Heat evaporant sources to obtain deposition rates of about 200 Å per minute from each source.
4. Place evaporant source shutter such that the thallium iodide source is open and the lead fluoride source is covered.
5. Open substrate shutter to expose the substrate to the evaporant stream until a predetermined amount of thallium iodide has condensed on the substrate. This predetermined amount of thallium iodide must be less than approximately 500 Å thickness, or the thallium iodide will become orthorhombic.
6. Move the evaporant source shutter so that the thallium iodide source is covered at the same instant the lead fluoride source is uncovered.
7. When a predetermined amount of lead fluoride has condensed on the substrate the source shutter is returned to the thallium iodide open - lead fluoride closed position. The predetermined amount of lead fluoride may be as little as 5 Å thickness, the preferred range being from about 5Å to about 50 Å.
8. Alternate thallium iodide and lead fluoride layers as many times as are required to obtain desired coating thickness ending with thallium iodide layer for humidity resistance.
9. The predetermined thicknesses for the different layers result from a computer generated effective refractive index profile designed to give antireflective behavior to the coating.

One possible explanation of the reason the thallium iodide thin film multiple layers continue to exist in the cubic phase at room temperature is that the lead fluoride layers compress the thallium iodide layers and maintain them at sufficient pressure at room temperature to constrain the thallium iodide in the cubic phase. Another possible explanation of the reason the thallium iodide thin film multiple layers continue to exist in the dubic phase is that vacuum deposited thallium iodide films of thicknesses up to a few hundred angstroms will always grow in the dubic (non-birefringent) phase on alkali halide substrates at room temperature. In this invention all the layers of thallium iodide in a stack of alternating layers of thallium iodide and buffer material layers are cubic. This is because the layers of thallium iodide are each less in thickness than the critical thickness for the orthorhombic form of thallium iodide. In addition, it appears that each layer of thallium iodide is ignorant of the existence of the previous layer of thallium iodide due to the layer of buffer material.

While we have herein taught the use of a layer of lead fluoride as the buffer layer separating the thallium iodide layers, the buffer layer is not limited to lead fluoride. The optical buffer layer material should be one which grows in the cubic phase in thin film form and also includes all the alkali halides including those of lithium, sodium, potassium, rubidium, and cesium combined with one of the halide gases fluorine, chlorine, bromine, and iodine.

Figure 2:
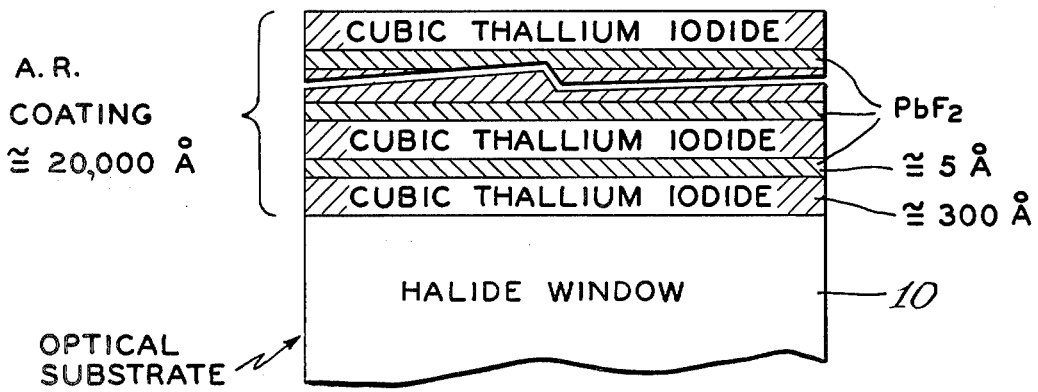
FIG. 2 is a cross section view of the improved AR coating of alternate layers of thallium iodide and lead fluoride.

FIG. 2 is a cross section view (not to scale) of the coating provided by this invention. The alternating layers of thallium iodide and lead fluoride (beginning and ending with thallium iodide) can be seen. The overall thickness of the composite coating may be in the order of 2 microns (20,000 Å) for antireflecting coatings at 10 m and thinner for shorter wavelengths and the individual layers of thallium iodide may be in the order of 300Å while the lead fluoride layers may be about 5 Å-50 Å.

Figure 3:
FIGS. 3 and 4 as well as 5 and 6 are photographs showing a visual comparison of a lens having the coating of the invention verses a coating according to the prior art.
Figure 4:

The photographic representations in the drawings show comparative results of a coating prepared in accordance with the invention and one not so prepared. FIGS. 3 and 4 show two photos taken in transmitted white light between parallel polarizers. FIG. 3 is of a two layer thallium iodide, lead fluoride coating on a potassium chloride substrate. The potassium chloride lens is half coated, the coated part being on the right side of the substrate and scatters light to give a dark appearance. FIG. 4 represents a 180 alternating layer thallium iodide, lead fluoride coating according to the invention. The coated area is on the bottom part of the potassium chloride substrate. The two layer film scatters light while the alternating layer film does not.

Figure 5:
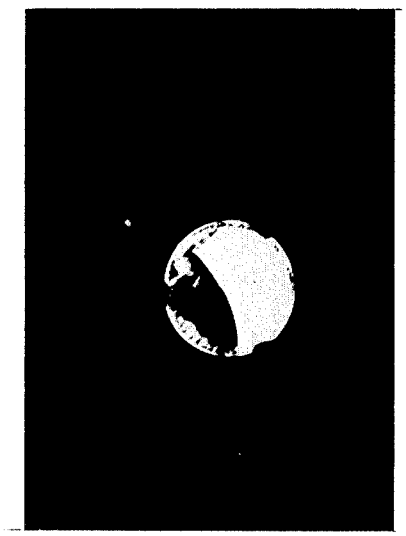
Figure 6:
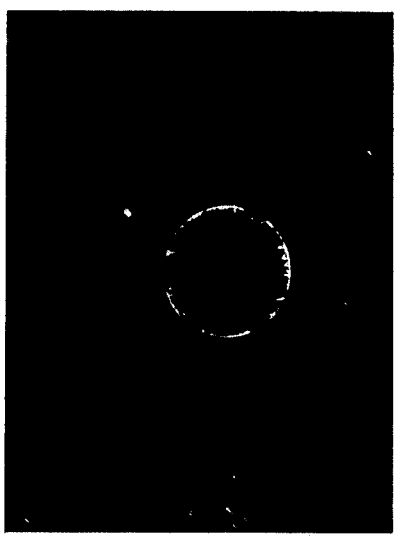

FIGS. 5 and 6 show two photos taken with the polarizers crossed to extinguish the light. FIG. 5 is the two layer film in the same orientation as in FIG. 3, and is very birefringent in the coated area. FIG. 6 is the alternate layer film and is not birefringent.

Samples of thallium iodide, lead fluoride alternating layer films were examined in our x-ray diffractometer. Table 1 shows results for a typical film. No orthorhombic thallium iodide lines are observed. The two diffraction lines that could not be attributed to $\beta$-lead fluoride indicate the presence of a cubic $\alpha$-thallium iodide with $a_o = 4.21$ Å. They are the (111) at 2.43 Å and the (321) at 1.12 Å.

Table 1

| Identification of Observed x-rays diffraction lines | | | | | |
|---|---|---|---|---|---|
| Observed | | $\beta$-PbF$_2$ | | Cubic TlI | |
| d(Å) | I* | d(Å) | hkl | d(Å) | hkl |
| 3.4 | m | 3.428 | 111 | | |
| 2.95 | m | 2.97 | 200 | 2.97 | 110 |
| 2.43 | f | | | 2.428 | 111 |
| 2.10 | s | 2.10 | 220 | 2.103 | 200 |
| 1.78 | s | 1.791 | 311 | | |
| 1.72 | m | 1.715 | 222 | 1.717 | 211 |
| 1.485 | m | 1.485 | 400 | 1.487 | 220 |
| 1.36 | m | 1.362 | 331 | | |
| 1.327 | m | 1.328 | 420 | 1.33 | 310 |
| 1.215 | m | 1.212 | 422 | 1.214 | 222 |
| 1.14 | m | 1.143 | 511 | | |

Table 1-continued

| Identification of Observed x-rays diffraction lines | | | | | |
|---|---|---|---|---|---|
| Observed | | β-PbF$_2$ | | Cubic TlI | |
| d(A) | I* | d(A) | hkl | d(A) | hkl |
| 1.12 | w | forbidden line for βPbF$_2$ | | 1.12 | 321 |
| 1.05 | m | 1.050 | 440 | 1.052 | 400 |
| 1.005 | m | 1.0043 | 531 | | |
| .099 | m | 0.9903 | 600 | 0.991 | 330 |
| 0.93 | m | 0.9394 | 620 | 0.94 | 420 |
| 0.906 | f | 0.9059 | 533 | | |

*Intensity: s = strong, m = medium, w = weak, f = faint

The embodiments of the invention in which an exclusive property or right is claimed are defined as follows:

1. A method of preparing a non-birefringent cubic thallium iodide thin film protective coating on potassium chloride optical elements, the method comprising:
   (a) provide an evaporative vacuum deposition system having therein a thallium iodide evaporation source and an optical buffer material evaporation source;
   (b) provide a shutter for the evaporant sources;
   (c) place a potassium chloride optical element to be coated in said evaporative deposition system;
   (d) evacuate the vacuum deposition system to $5 \times 10^{-6}$ torr pressure or lower;
   (e) heat the evaporant sources to obtain deposition rates of not more than about 2000 Å per minute from each;
   (f) position the shutter to deposit first on said element a layer of cubic thallium iodide to a thickness of up to approximately 500 Å;
   (g) deposit next optical buffer material to a thickness of from about 5 Å to about 50 Å;
   (h) repeat steps f and g a plurality of times to produce a coating of required thickness comprising alternating layers of cubic thallium iodide and optical buffer material;
   (i) repeat step f to complete the coating.

2. The method of claim 1 wherein the optical buffer material is lead fluoride.

3. The method of claim 1 wherein the optical buffer material is an alkali halide.

4. The method of claim 1 wherein the deposition rate is about 200 Å per minute.

* * * * *